(12) United States Patent
Avraham et al.

(10) Patent No.: US 11,528,038 B2
(45) Date of Patent: Dec. 13, 2022

(54) CONTENT AWARE DECODING USING SHARED DATA STATISTICS

(71) Applicant: Western Digital Technologies, Inc., San Jose, CA (US)

(72) Inventors: Dudy David Avraham, Even Yehuda (IL); Ran Zamir, Ramat Gan (IL); Omer Fainzilber, Herzeliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 34 days.

(21) Appl. No.: 17/211,605

(22) Filed: Mar. 24, 2021

(65) Prior Publication Data
US 2022/0149870 A1    May 12, 2022

Related U.S. Application Data

(60) Provisional application No. 63/110,738, filed on Nov. 6, 2020.

(51) Int. Cl.
*H03M 13/35* (2006.01)
*G06F 11/10* (2006.01)

(52) U.S. Cl.
CPC ....... *H03M 13/353* (2013.01); *G06F 11/1068* (2013.01)

(58) Field of Classification Search
CPC .................. G06F 11/1068; H03M 13/353
See application file for complete search history.

(56) References Cited

U.S. PATENT DOCUMENTS

| | | |
|---|---|---|
| 6,381,106 B1 | 4/2002 | Pinarbasi |
| 6,928,590 B2 | 8/2005 | Ilkbahar et al. |
| 7,035,062 B1 | 4/2006 | Mao et al. |

(Continued)

FOREIGN PATENT DOCUMENTS

| | | |
|---|---|---|
| JP | 2008176911 A | 7/2008 |
| JP | 2012118979 A | 6/2012 |

(Continued)

OTHER PUBLICATIONS

Choe et al. "Near-data processing for machine learning," CoRR, vol. abs/1610.02273, 2016, 9 pages.

(Continued)

*Primary Examiner* — Guy J Lamarre
(74) *Attorney, Agent, or Firm* — Patterson & Sheridan, LLP; Steven H. VerSteeg

(57) ABSTRACT

A method and apparatus for content aware decoding utilizes a pool of decoders shared data statistics. Each decoder generates statistical data of content it decodes and provides these statistics to a joint statistics pool. As codewords arrive at the decoder pool, the joint statistics are utilized to estimate or predict any corrupted or missing bit values. Codewords may be assigned to a specific decoder, such as a tier 1 decoder, a tier 2 decoder, or a tier 3 decoder, based on a syndrome weight or a bit error rate. The assigned decoder updates the joint statistics pool after processing the codeword. In some embodiments, each decoder may additionally maintain local statistics regarding codewords, and use the local statistics when there is a statistically significant mismatch between the local statistics and the joint statistics pool.

20 Claims, 7 Drawing Sheets

(56) References Cited

U.S. PATENT DOCUMENTS

| | | |
|---|---|---|
| 7,982,996 B2 | 7/2011 | Smith et al. |
| 8,039,885 B2 | 10/2011 | Wang et al. |
| 8,064,159 B2 | 11/2011 | Sakamoto et al. |
| 8,085,490 B2 | 12/2011 | Franca-Neto et al. |
| 8,194,361 B2 | 6/2012 | Kudo et al. |
| 8,259,409 B2 | 9/2012 | Bragana et al. |
| 8,286,048 B1 | 10/2012 | Chen et al. |
| 8,301,979 B2 | 10/2012 | Sharon et al. |
| 8,320,080 B1 | 11/2012 | Braganca et al. |
| 8,325,442 B2 | 12/2012 | Koui et al. |
| 8,374,026 B2 | 2/2013 | Sharon et al. |
| 8,416,539 B2 | 4/2013 | Carey et al. |
| 8,467,148 B2 | 6/2013 | Iwasaki et al. |
| 8,472,151 B2 | 6/2013 | Wang et al. |
| 8,549,385 B2 | 10/2013 | Yang |
| 8,582,240 B1 | 11/2013 | Chen et al. |
| 8,687,319 B2 | 4/2014 | Igarashi et al. |
| 8,824,104 B1 | 9/2014 | Koui et al. |
| 8,924,815 B2 * | 12/2014 | Frayer ............... H03M 13/13 714/755 |
| 8,953,283 B2 | 2/2015 | Shimizu et al. |
| 8,970,996 B2 | 3/2015 | Nagasaka et al. |
| 9,042,057 B1 | 5/2015 | Diao et al. |
| 9,064,508 B1 | 6/2015 | Shiimoto et al. |
| 9,099,107 B1 | 8/2015 | Igarashi et al. |
| 9,099,124 B1 | 8/2015 | Freitag et al. |
| 9,208,801 B2 | 12/2015 | Zhang et al. |
| 9,230,571 B1 | 1/2016 | Chen et al. |
| 9,230,597 B2 | 1/2016 | Shimoto et al. |
| 9,236,564 B2 | 1/2016 | Carey et al. |
| 9,275,672 B2 | 3/2016 | Shiroishi et al. |
| 9,305,574 B1 | 4/2016 | Nagasaka et al. |
| 9,337,415 B1 | 5/2016 | Oh et al. |
| 9,368,135 B2 | 6/2016 | Gao |
| 9,412,410 B1 * | 8/2016 | Bentley ............... G11B 5/024 |
| 9,881,637 B1 | 1/2018 | Wilson et al. |
| 9,893,273 B2 | 2/2018 | Hu et al. |
| 10,063,258 B2 | 8/2018 | Goldenberg et al. |
| 10,121,497 B1 | 11/2018 | Takahashi et al. |
| 10,186,284 B2 | 1/2019 | Narita et al. |
| 10,236,021 B2 | 3/2019 | Narita et al. |
| 10,276,193 B2 | 4/2019 | Narita et al. |
| 10,325,618 B1 | 6/2019 | Wu et al. |
| 10,366,714 B1 | 7/2019 | Olson et al. |
| 10,460,752 B2 | 10/2019 | Freitag et al. |
| 10,498,366 B2 | 12/2019 | Lin et al. |
| 10,522,744 B2 | 12/2019 | Jan et al. |
| 10,566,015 B2 | 2/2020 | Freitag et al. |
| 10,613,927 B1 * | 4/2020 | Symons ............... H03M 13/45 |
| 10,700,706 B2 | 6/2020 | Zhang et al. |
| 2002/0135935 A1 | 9/2002 | Covington |
| 2008/0112095 A1 | 5/2008 | Carey et al. |
| 2008/0294960 A1 | 11/2008 | Sharon et al. |
| 2008/0304176 A1 | 12/2008 | Takagishi et al. |
| 2009/0059423 A1 | 3/2009 | Yamada et al. |
| 2009/0257151 A1 | 10/2009 | Zhang et al. |
| 2009/0310244 A1 | 12/2009 | Shimazawa et al. |
| 2010/0157465 A1 | 6/2010 | Sakamoto et al. |
| 2011/0134561 A1 | 6/2011 | Smith et al. |
| 2013/0064971 A1 | 3/2013 | Carey et al. |
| 2013/0250456 A1 | 9/2013 | Yamada et al. |
| 2014/0068393 A1 | 3/2014 | Varnica et al. |
| 2014/0139952 A1 | 5/2014 | Takeo et al. |
| 2014/0177100 A1 | 6/2014 | Sugiyama et al. |
| 2014/0203383 A1 | 7/2014 | Guo |
| 2015/0010780 A1 | 1/2015 | Carey et al. |
| 2015/0124347 A1 | 5/2015 | Shimoto et al. |
| 2016/0006462 A1 | 1/2016 | Hanham et al. |
| 2016/0027455 A1 | 1/2016 | Kudo et al. |
| 2017/0236537 A1 | 8/2017 | Murakami et al. |
| 2018/0091172 A1 * | 3/2018 | Ilani ............... G06F 11/1068 |
| 2018/0268848 A1 | 9/2018 | Narita et al. |
| 2018/0343017 A1 | 11/2018 | Kumar et al. |
| 2019/0088274 A1 | 3/2019 | Narita et al. |
| 2019/0088275 A1 | 3/2019 | Narita et al. |
| 2019/0140665 A1 * | 5/2019 | Shin ............... H03M 13/27 |
| 2019/0259412 A1 | 8/2019 | Gao et al. |
| 2019/0279667 A1 | 9/2019 | Freitag et al. |
| 2019/0288707 A1 | 9/2019 | Kumar et al. |
| 2019/0393901 A1 | 12/2019 | Fainzilber et al. |
| 2020/0013429 A1 | 1/2020 | Freitag et al. |
| 2020/0099402 A1 | 3/2020 | Avraham et al. |
| 2020/0099404 A1 | 3/2020 | Avraham et al. |
| 2020/0105999 A1 | 4/2020 | Jeong et al. |
| 2020/0235757 A1 * | 7/2020 | Achtenberg ...... H03M 13/3707 |
| 2020/0350930 A1 | 11/2020 | Avraham et al. |
| 2020/0382144 A1 | 12/2020 | Avraham et al. |
| 2021/0344356 A1 * | 11/2021 | Berman ............ G11C 16/0483 |

FOREIGN PATENT DOCUMENTS

| | | |
|---|---|---|
| JP | 2017097942 A | 6/2017 |
| WO | 2007082626 A2 | 7/2007 |

OTHER PUBLICATIONS

International Search Report and Written Opinion issued in Internation Patent Application No. PCT/US2019/067069, dated Apr. 2, 2020 (10 pages).

Related U.S. Appl. No. 16/051,416, filed Jul. 31, 2018.

International Search Report and Written Opinion issued in corresponding International Application No. PCT/US2020/034728, dated Aug. 13, 2020 (9 pages).

Related U.S. Appl. No. 16/014,128, filed Jun. 21, 2018.

* cited by examiner

300

```
1011  0110  1101  1110  1011
0110  1101  0000  1111  0011
1011  1111  1101  0110  1111
1101  1111  1111  0001  1111
1111  1001  0110  1001  1101
0010  1101  1000  1100  0100
0100  1111  0110  1011  0101
1111  0110  0010  0101  1111
1001  0010  0000  0100  1000
0000  0100  0110  1000  0000
```

US 11,528,038 B2

CONTENT AWARE DECODING USING SHARED DATA STATISTICS

CROSS-REFERENCE TO RELATED APPLICATIONS

This application claims benefit of U.S. Provisional Patent Application Ser. No. 63/110,738, filed Nov. 6, 2020, which is herein incorporated by reference.

BACKGROUND

Field

Embodiments of the present disclosure generally relate to data error detection and correction, and more particularly, the use of data statistics for content aware error detection and correction.

Description of the Related Art

As data storage products requirements increase, the performance limit of a single decoder of stored data for transmission to a host have been reached. In response, many data storage products have employed pools of decoders. To improve quality of service (QoS), an individual decoder may maintain statistical information about content characteristics, as blocks of data decoded together typically have similar data characteristics. By maintaining statistical information, a decoder may be configured to decode more efficiently by predictively configuring its decoding strategy based on data statistics.

However, because the data statistics are based on the data decoded by an individual decoder, their predictive ability may be limited, resulting in, for example, missed predictions that result in "head of line blocking" scenarios that may degrade QoS.

What is needed are systems and methods that overcome these and other deficiencies.

SUMMARY

The present disclosure generally relates to content aware decoding using shared data statistics. Each decoder generates statistical data of content it decodes and provides these statistics to a joint statistics pool. As codewords arrive at the decoder pool, the joint statistics are utilized to estimate or predict any corrupted or missing bit values. Codewords may be assigned to a specific decoder, such as a tier 1 decoder, a tier 2 decoder, or a tier 3 decoder, based on a syndrome weight or a bit error rate. The assigned decoder updates the joint statistics pool after processing the codeword. In some embodiments, each decoder may additionally maintain local statistics regarding codewords, and use the local statistics when there is a statistically significant mismatch between the local statistics and the joint statistics pool.

In one embodiment, a data storage device is disclosed that includes a non-volatile memory (NVM), and a controller coupled to the NVM that includes a plurality of decoders, a first decoder configured to receive a first codeword, the first decoder configured to generate first data statistics for the first codeword, and a second decoder configured to receive a second codeword, the second decoder configured to generate second data statistics for the second codeword. The data storage device further includes a joint data statistics module configured to receive the first and second data statistics.

In another embodiment, a controller for a data storage device is disclosed. The controller includes an I/O to one or more NVMs, and a processor configured to perform a method for content aware decoding. The method includes receiving a codeword from the one or more NVMs at a first decoder, generating data statistics for the codeword, and providing the data statistics to a joint statistics module, the joint statistics module coupled to a plurality of decoders that include the first decoder.

In another embodiment, a system for storing data is disclosed, including an NVM means, and a controller means for executing a method for content aware decoding. The method includes receiving from the NVM means at a first decoder means of a plurality of decoder means, a first codeword, decoding the first codeword at the first decoder means, and generating a first data statistic based on decoding the first codeword. The method further includes updating a joint data statistics module coupled to each of the plurality of decoder means, with the first data statistic, receiving a second a second codeword from the NVM means, and assigning the second codeword to a second decoder means of the plurality of decoder means, based on the joint data statistics module.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments.

Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to content aware decoding using shared data statistics. Each decoder generates statistical data of content it decodes and provides these statistics to a joint statistics pool. As codewords arrive at the decoder pool, the joint statistics are utilized to estimate or predict any corrupted or missing bit values. Codewords may be assigned to a specific decoder, such as a tier 1 decoder, a tier 2 decoder, or a tier 3 decoder, based on a syndrome weight or a bit error rate. The assigned decoder updates the joint statistics pool after processing the codeword. In some embodiments, each decoder may additionally maintain local statistics regarding codewords, and use the local statistics when there is a statistically significant mismatch between the local statistics and the joint statistics pool.

Figure 1:
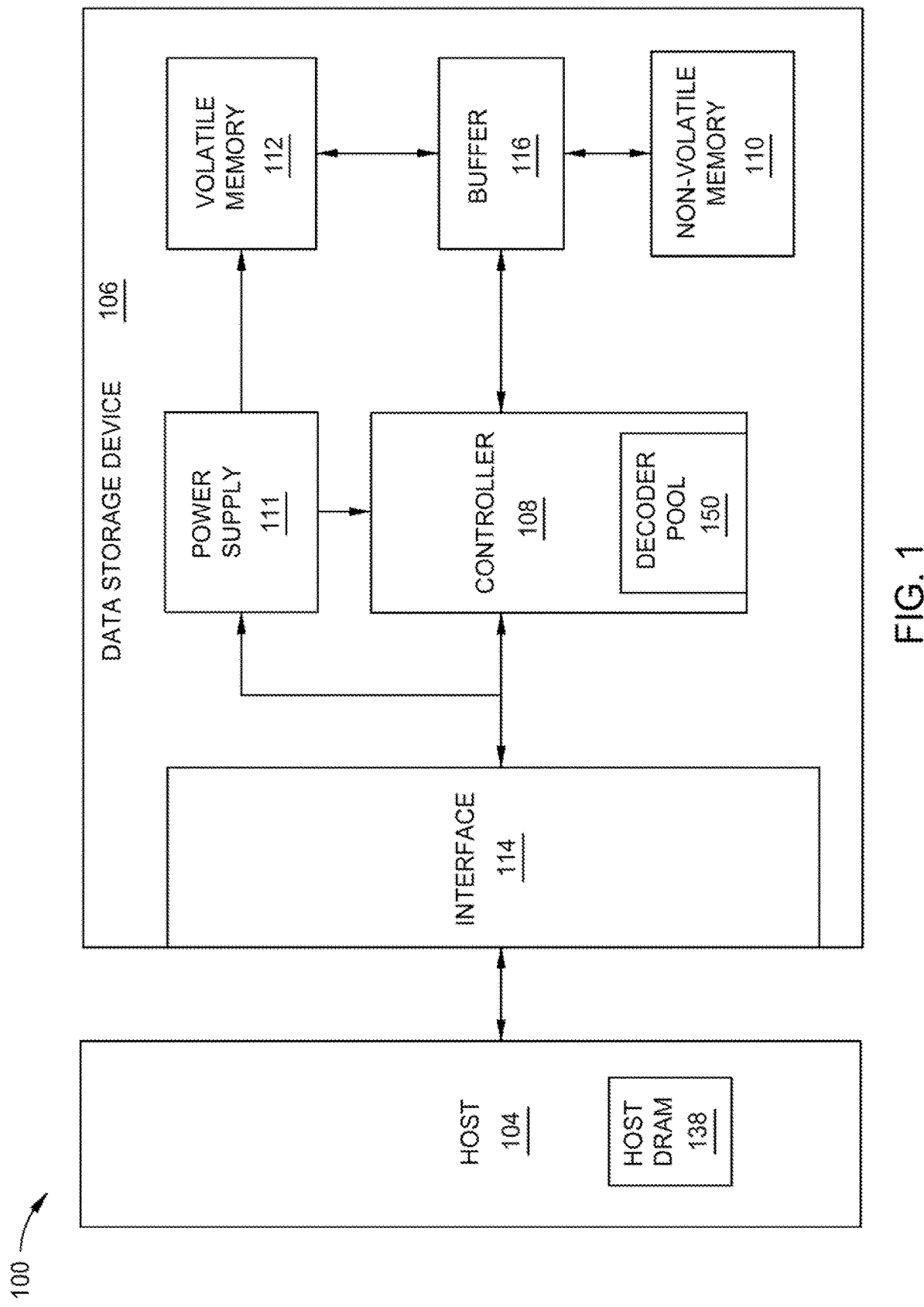
FIG. 1 is a schematic block diagram illustrating a storage system in which data storage device may function as a storage device for a host device, according to certain embodiments.

FIG. 1 is a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some embodiments, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some embodiments, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some embodiments, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some embodiments, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some embodiments, a single physical chip may include a plurality of dies (i.e., a plurality of memory units). In some embodiments, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some embodiments, each memory unit of NVM 110 may include any type of NVM devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of NVM devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some embodiments, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some embodiments, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some embodiments, the controller 108 may use volatile memory 112 as a cache. For instance, the controller 108 may store cached information in volatile memory 112 until cached information is written to NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

The controller 108 includes a decoder pool 150. The decoder pool 150 may be part of a low-density parity-check (LDPC) engine of the controller 108. The decoder pool 150 may include one or more decoders, where each of the one or more decoders have one or more gears. Each of the one or more gears may either be a tier 1, a tier 2, or a tier 3 decoder. The exemplification of the different tiers of decoders is not intended to be limiting, but to provide an example of a possible embodiment. For example, the usage of the term "tier" may be utilized as a placeholder for different decoders specialized for different cases. Furthermore, more than or less than the exemplified tiers of decoders are contemplated.

The tier 2 decoder may be utilized for less intensive decoding tasks, such as for low bit error rate (BER) codewords and the tier 3 decoder may be utilized for more intensive decoding tasks, such as for higher BER codewords. In other embodiments, the selected decoder may be based on whether the receive codeword exceeds some certain syndrome weight threshold of the tier 1 decoder, the tier 2 decoder, or the tier 3 decoder. The decoder utilized may be dependent on the decoding operation as well as the current resources utilized, such as current power consumption by the other components of the data storage device. The various decoders may use a tradeoff between latency and power to correction capability, such that the tradeoff is a gear shifting scheme. For example, the tier 1 decoder may be a bit flipping decoder, while the tier 2 and the tier 3 decoders may be message passing decoders. In this context, a tier 2 decoder would be a fasteter message passing decoder while a tier 3 would be a stronger message passing decoder.

Figure 2:
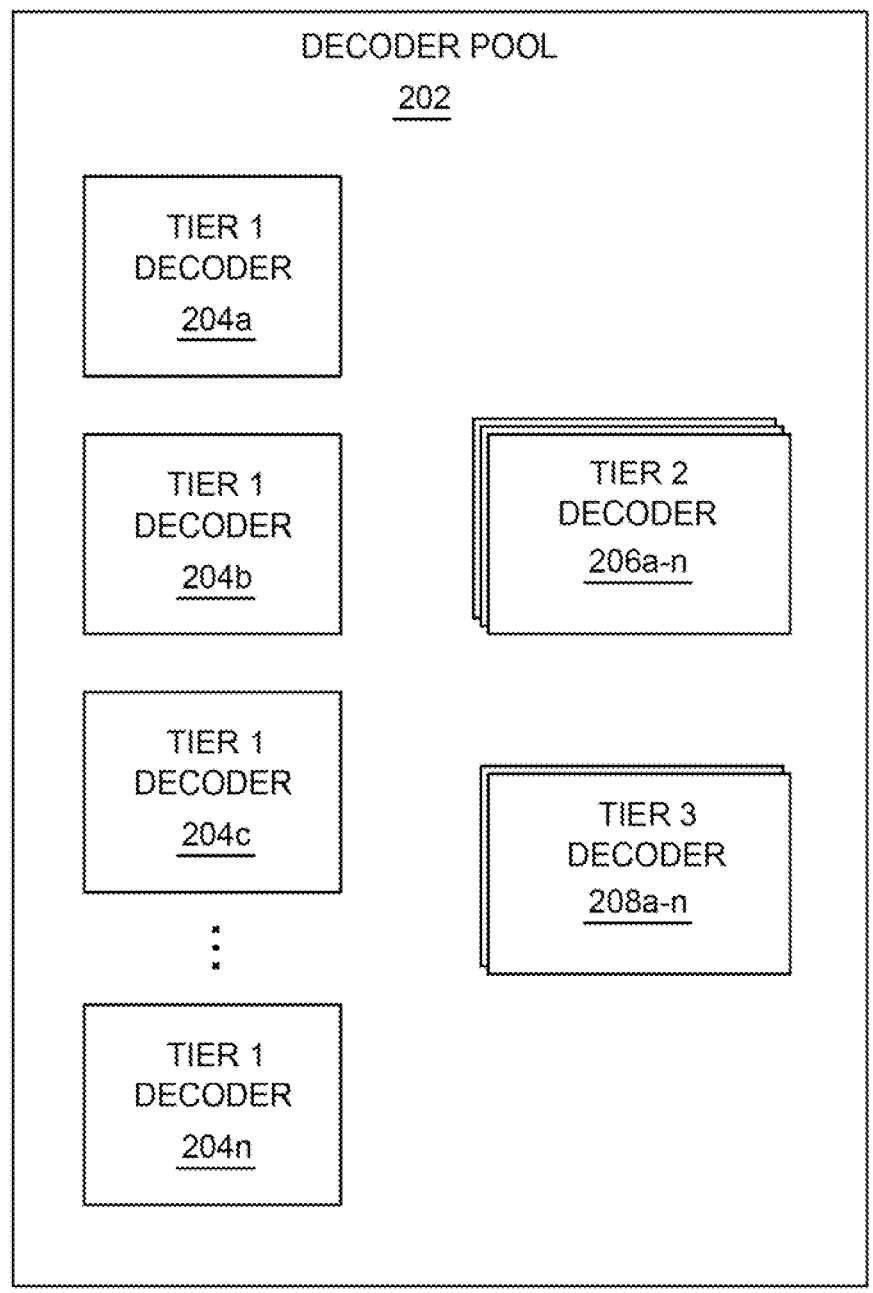
FIG. 2 is a schematic block diagram illustrating a decoder pool architecture, according to certain embodiments.

FIG. 2 is a schematic block diagram illustrating a decoder pool architecture 200, according to disclosed embodiments. The decoder pool architecture 200 may be the decoder pool 150 of FIG. 1. In conventional approaches, a codeword provided to a decoder pool may be provided first to a low order decoder (e.g., tier 1 decoder), but if the low order decoder fails, send the codeword to a higher order decoder (e.g., tier 2 and/or tier 3 decoder). Rather than using a single tier 1+tier 2+tier 3 engine, the gears are divided into pools of independent decoders. For example, if a codeword takes a long decode latency with the tier 3 decoder, the tier 1 decoder and the tier 2 decoder may still decode other codewords that may have shorter decode latency than the tier 3 decoder. The decoder pool architecture includes a plurality of tier 1 decoders 204a-n, a plurality of tier 2 decoders 206a-n, and a plurality of tier 3 decoders 208a-n. In some embodiments, the number of tier 1 decoders is greater than the number of tier 2 decoders and the number of tier 2 decoders is greater than the number of tier 3 decoders.

Furthermore, the controller, such as the controller 108 may be configured to determine which decoder of the plurality of decoders 204a-n, 206a-n, 208a-n will decode the received codeword. The received codeword may be from volatile memory, such as the volatile memory 112 of FIG. 1, or from the NVM, such as the NVM 110 of FIG. 1. For example, if the controller determines that the received codeword includes a high BER, the received codeword may be decoded by one of the plurality of tier 3 decoders 208a-n, rather than one of the plurality of tier 1 decoders 204a-n or one of the plurality of tier 2 decoders 206a-n. If a codeword is sent to a lower order decoder but fails to properly decode, the tier 1 decoder updates a joint statistics pool (discussed below), and in some embodiments, may also update its own data statistics (discussed below), before passing the codeword to a higher-order decoder.

An Iterative Content Aware Decoder (ICAD) may be embedded with each decoder of the plurality of decoders 204a-n, 206a-n, 208a-n of the decoder pool 202. The ICAD allows for the host data statistics to be embedded in the decoder computation logic, such that the decoder works better when better host data statistics are stored. When host data statistics are not available, the data statistics are estimated for the relevant codeword. Furthermore, the ICAD works in an iterative manner, such that the ICAD iterates between decoding the codeword and re-estimating the host data statistics.

Because the host minimum data size may be larger than a flash memory unit (FMU) size, data may be stored across multiple sequential FMUs of the NVM, such as the NVM 110 of FIG. 1. Because data is read sequentially, codewords may hold similar host data and have similar data statistics. The ICAD may extract the data statistics and share the extracted data statistics among the decoders of the plurality of decoders 204a-n, 206a-n, 208a-n of the decoder pool 202. Furthermore, the data statistics may also be jointly estimated and shared among the decoders of the plurality of decoders 204a-n, 206a-n, 208a-n of the decoder pool 202. By jointly estimating the data statistics and sharing the joint estimated statistics across each decoder of the plurality of decoders 204a-n, 206a-n, 208a-n of the decoder pool 202, decoder latency, correction capability, and system performance may be improved. It is to be understood that the previously described example is not intended to be limiting.

Figures 3A, 3B:
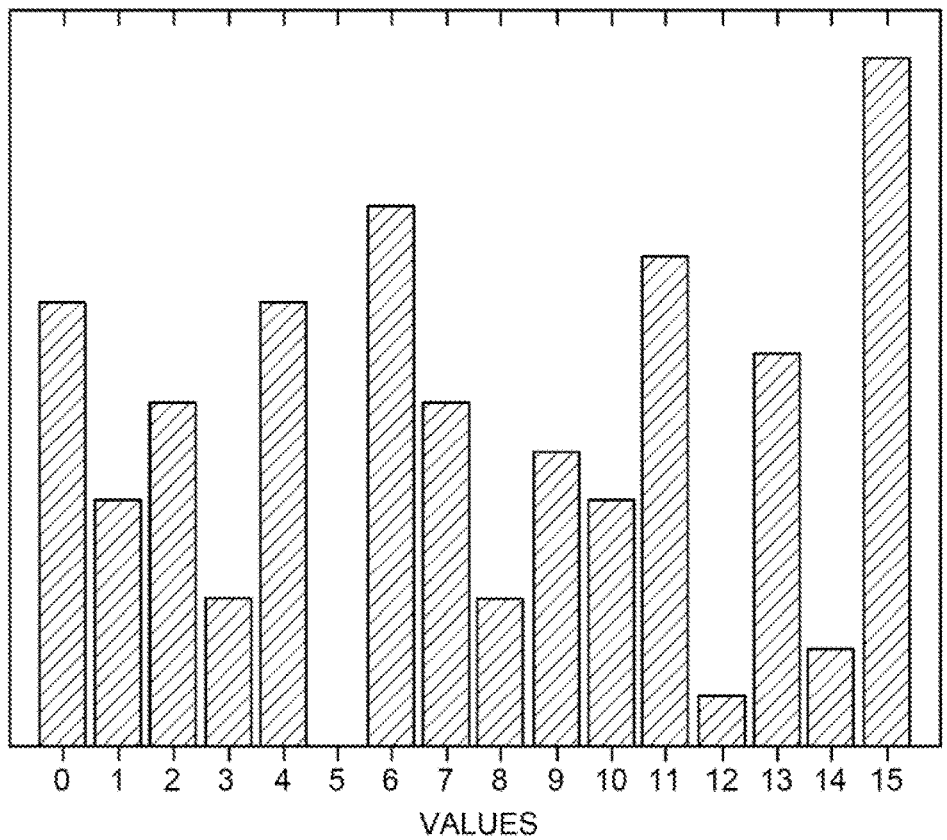
FIG. 3A is an example of a set of 4 bit words.
FIG. 3B is a histogram illustrating the 4 bit word arrangement frequency according to certain embodiments.

FIG. 3A is an example of a set 300 of 4 bit words. FIG. 3B is a histogram 350 illustrating the 4 bit word arrangement frequency of the set 300 of FIG. 3A. Each four bit combination corresponds to a bit word that is a binary representation of a decimal value. For example, the four bit combination may be in a form of "abcd", where "a", "b", "c", and "d" each corresponds to either a 0 or a 1. The four bit combination may converted from binary to decimal by the following equation: $(abcd)2=(a\times2^3)+(b\times2^2)+(c\times2^1)+(d\times2^0)=(x)_{10}$, where "x" is the decimal value of the binary four bit combination. Each of the 4 bit words corresponds to a value between 0 and 15. For example, 0000 equals 0, 0110 equals 6, and 1111 equals 15.

The histogram 350 is a graphical representation of the frequency of each value of the 4 bit word of the set 300. For example, 0000 or 0 occurs 4 times and 1111 or 15 occurs 10 times in the set 300. The histogram 350 may be dynamically updated for each new 4 bit word of the set 300. For example, the value 15 has the highest frequency, and the value 5 has the lowest frequency. When the decoder or the joint data statistics module receives a 4 bit word, where one or more of the bits are corrupted, the decoder or the joint data statistics module may utilize the histogram 350 to determine what the one or more bit values may be. For example, the 4 bit word x110 is received by the decoder or the joint data statistics module, where "x" refers to the bit that is unknown. The 4 bit word may either be 6, where the 4 bit word is 0110, or 14, where the 4 bit word is 1110. When analyzing the histogram 350, the value of 6 has a higher probability of occurring than the value of 14, such that the decoder or the joint data statistics module may estimate that the unknown bit is "0". However, without the histogram 350 statistics, the best guess estimate of what the unknown bit could be would be 50% "0" and 50% "1".

Figure 4:
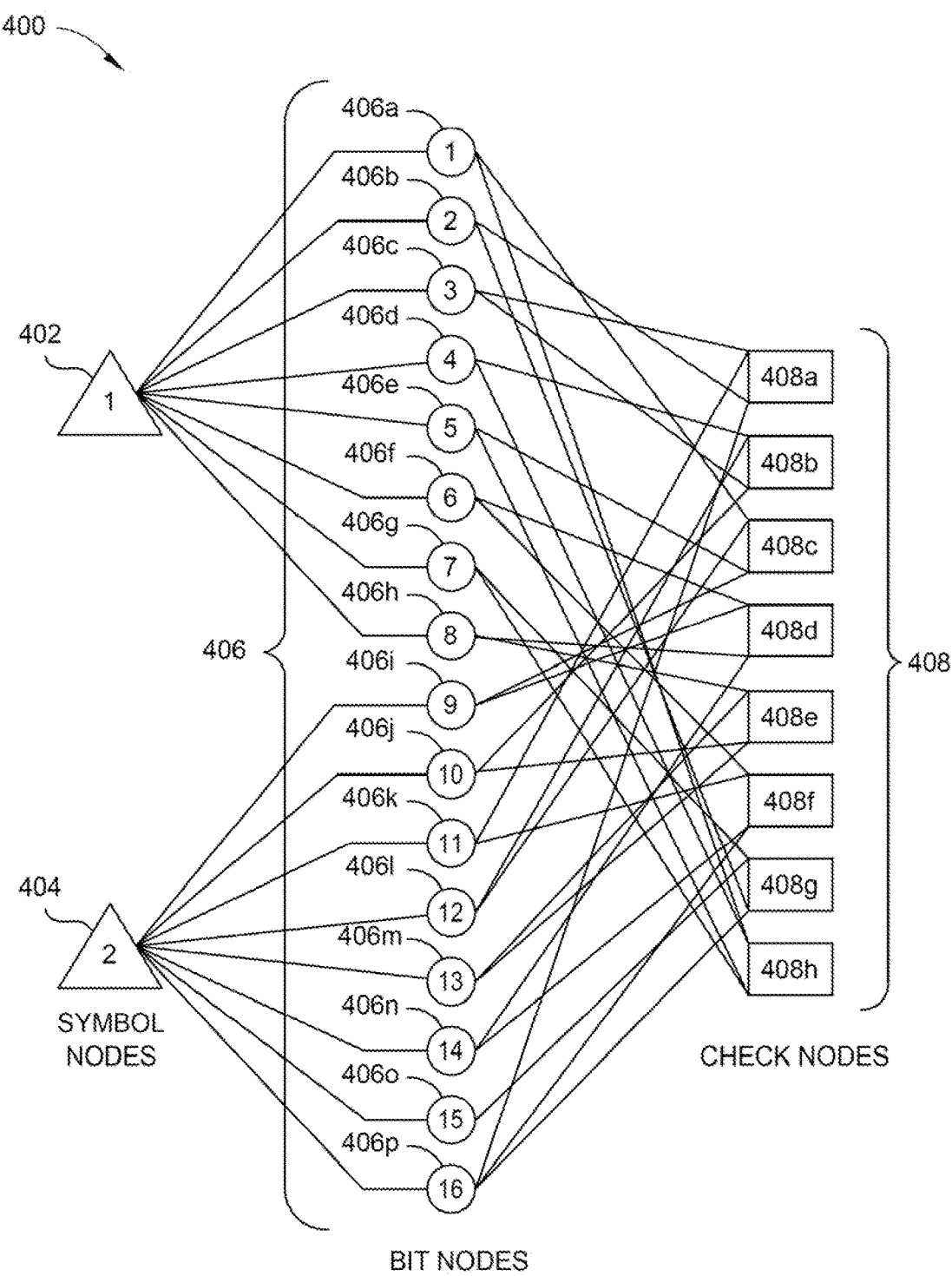
FIG. 4 is a schematic illustration of an Iterative Content Aware Decoder (ICAD) logic, according to certain embodiments.

FIG. 4 is a schematic illustration of an ICAD logic 400, according to disclosed embodiments. The ICAD logic 400 includes one or more symbol nodes 402, 404, a plurality of bit nodes 406a-p, and a plurality of check nodes 408a-h. The plurality of bit nodes 406a-p may be collectively referred to as the plurality of bit nodes 406, and the plurality of check nodes 408a-h may be collectively referred to as the plurality of check nodes 408. Each of the one or more symbol nodes 402, 404 may be associated with about 8 bit nodes in the depicted embodiment, such that a first symbol node 402 is associated with bit nodes 406a-h and a second symbol node 404 is associated with bit nodes 406i-p.

In one embodiment, bits in the data are dependent. For example, in a text file, the bits are organized in bytes where each byte represents a character. In the example of a text file, the most used characters are alphanumeric, spaces and punctuation marks, while the rest of the characters are less common. This indicates that bits from the same byte are statistically dependent and knowing part of the bits within a byte increases the reliability of the other bits within the same byte. The data may be divided into groups such that all bits in a group are statistically dependent. Each group is considered as a symbol or a symbol node.

In FIG. 4, the symbols are groups of 8 bits, indicated by the 8 bit nodes 406a-h, 406i-p. During the decoding operation performed by the ICAD, each of the one or more symbol nodes 402, 404 sends a message to each bit node of the plurality of bit nodes 406. The message may include the probability of the bit to be "0" or "1" as described in FIGS. 3A and 3B, above, according to the information from the other bits of the same codeword and the data statistics that reflect the probability of each symbol. The check nodes 408 are provided to check the values in each of the bit nodes of the plurality of bit nodes 406 to ensure that the bit node values are accurate. The check nodes 408 may include parity constraints of the codeword bits, such that the bit node values are constrained.

The probabilities may be learned during the encoding procedure, where the data is obtained without errors. However, learning the statistics during the encoding procedure may be costly as the learned statistics will need to be stored in the memory, such as the NVM 110 of FIG. 1, of the data storage device. By scanning the data and counting the occurrence of each symbol in the data, such as during the data statistics estimation scheme described above, probabilities are computed and stored as additional information for future reads of the data. Furthermore, the probabilities may be learned from the read data itself. The number of errors may be sufficiently low, such that probabilities with high accuracy maybe obtained. The probabilities may also be estimated during the decoding procedure. At each stage of decoding, each bit holds its probability to be "0" or "1", as mentioned above. Given these probabilities, the probabilities for each occurrence of each symbol may be obtained.

Figure 5:
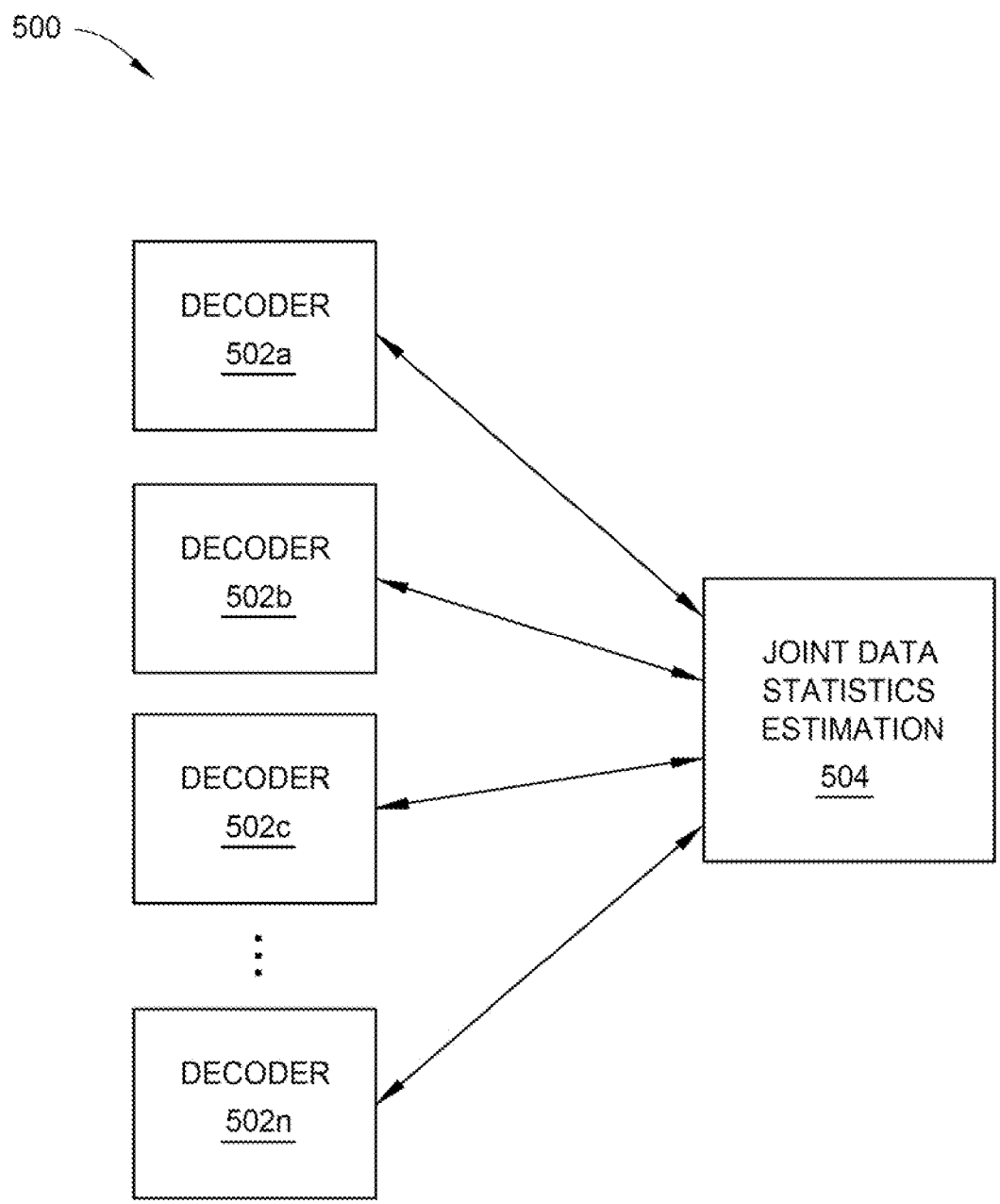
FIG. 5 is a schematic block diagram illustrating an implementation of an ICAD in a decoder pool, according to certain embodiments.

FIG. 5 is a schematic block diagram illustrating an implementation of an ICAD in a decoder pool, according to disclosed embodiments. The decoder pool may be the decoder pool 202 of FIG. 2. Rather than having a host data statistics estimation module for each decoder of the plurality of decoders 502a-n, the plurality of decoders 502a-n are coupled to a joint data statistics estimation module 504, such that the data statistics are jointly estimated by all of the decoders of the plurality of decoders 502a-n coupled to the joint data statistics estimation module 504.

The data statistics may be jointly estimated for each decoder of the plurality of decoders 502a-n by keeping a joint representation of the data statistics for all codewords of "k" bit length, where "k" refers to a numerical value of the bit length. The data statistics may be stored as a histogram, such as the histogram 350 of FIG. 3, in each decoder of the plurality of decoders 502a-n, where the histogram is continuously updated with each codeword decoded with a "k" bit length. Each of the plurality of decoders 502a-n sends the updated statistics to the joint data statistics estimation module 504, where the joint data statistics module 504 consolidates the individual updated statistics and sends back the global statistics to each decoder of the plurality of decoders 502a-n.

At each step that the individual decoder, such as the first decoder 502a, passes the updated data statistics to the joint data statistics estimation module 504, the decoder passes the difference from the previous estimation. For example, the difference may be exemplified as "bin1: +5, bin2: −7," and so-forth. When the decoding of the codeword is completed, the host data associated with the decoded codeword is transferred to the target location, such as the host device, where the data statistics may be a noiseless version.

The data from each decoder may be taken using a weight that reflects the reliability, such that codewords at the beginning of the decoding operation or with high bit error rate are given a higher weight than codewords that are almost or fully decoded. Furthermore, past decoded codewords may also be taken into account with a certain weight, which may decrease with time to reflect changes in the data and to allow the data statistics to change with respect to time. The weights may account for the probability of receiving a certain bit of the codeword, as described in FIGS. 3A and 3B.

Figure 7:
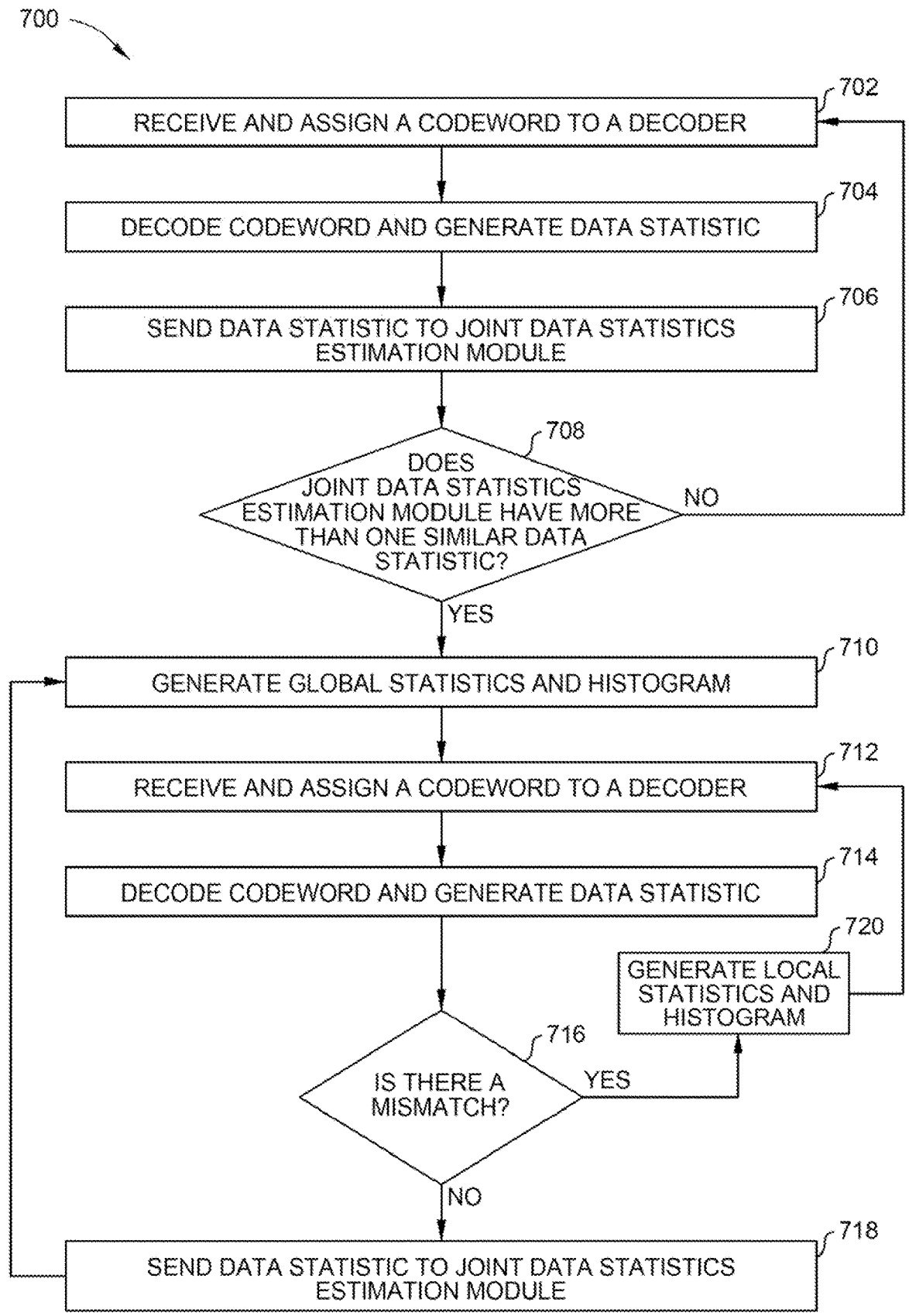
FIG. 7 is a flowchart illustrating the implementation of an ICAD in a decoder pool, according to certain embodiments.

Referring to the flowchart 700 of FIG. 7, the first decoder 502a receives a first codeword from the NVM, such as the NVM 110 of FIG. 1, at block 702. The first codeword may be assigned to a tier 1, a tier 2, or a tier 3 decoder based on the characteristics of the codeword, such as the bit error rate. The first codeword is decoded by the first decoder 502a, where a first data statistic for the first codeword is generated and stored by the first decoder 502a at block 704. After generating the first data statistic for the first codeword, the generated first data statistic is transferred to the joint data statistics estimation module 504 at block 706. It is to be understood that the timing of sending the generated first data statistic to the joint data statistics estimation module may be a configurable or adaptive timing based on the operation or the conditions of the data storage device, such as the data storage device 106 of FIG. 1. At block 708, the controller, such as the controller 108 of FIG. 1, determines if the joint data statistics estimation module 504 includes more than one similar data statistic. As host data is often longer than an ECC code word and is usually read sequentially, decoded ECC words of close proximity in time may have similar data statistics. If there is not a similar data statistic, the controller waits to receive and assign a second codeword to a decoder.

A second decoder 502b receives the second codeword from the NVM at block 702. The second codeword and the first codeword are substantially similar, such that the data statistics of the codewords is similar. The second decoder 502b decodes the second codeword and generates a second data statistic associated with the second codeword at block 704. The generated second data statistic is transferred to the joint data statistics estimation module 504 at block 706.

The joint data statistics estimation module 504 receives both generated first data statistic and generated second data statistic at block 708. Because the first codeword and the second codeword are substantially similar, the generated first data statistic is updated by the generated second data statistic, such that the global statistics includes the generated first data statistic and the generated second data statistic at block 710. Furthermore, the joint data statistics estimation module 504 generates a histogram utilizing the global statistics at block 710.

A third codeword is retrieved from the NVM by the controller, such as the controller 108 of FIG. 1 at block 712. Based on the global statistics, the appropriate decoder of the plurality of decoders 502a-n receives the third codeword. For example, the first decoder 502a may receive the third codeword based on the generated histogram and the global statistics. The third codeword is decoded, and the third data statistics are generated at block 714. At block 716, the controller determines if there is a mismatch between the generated third data statistics and the global statistics. If there is not a mismatch at block 716, then the generated third data statistics are transferred to the joint data statistics estimation module 504 at block 718, where the global statistics and the histogram is updated with the generated third data statistics at block 710. In some examples, the first codeword, the second codeword, and the third codeword are sequential.

Figure 6:
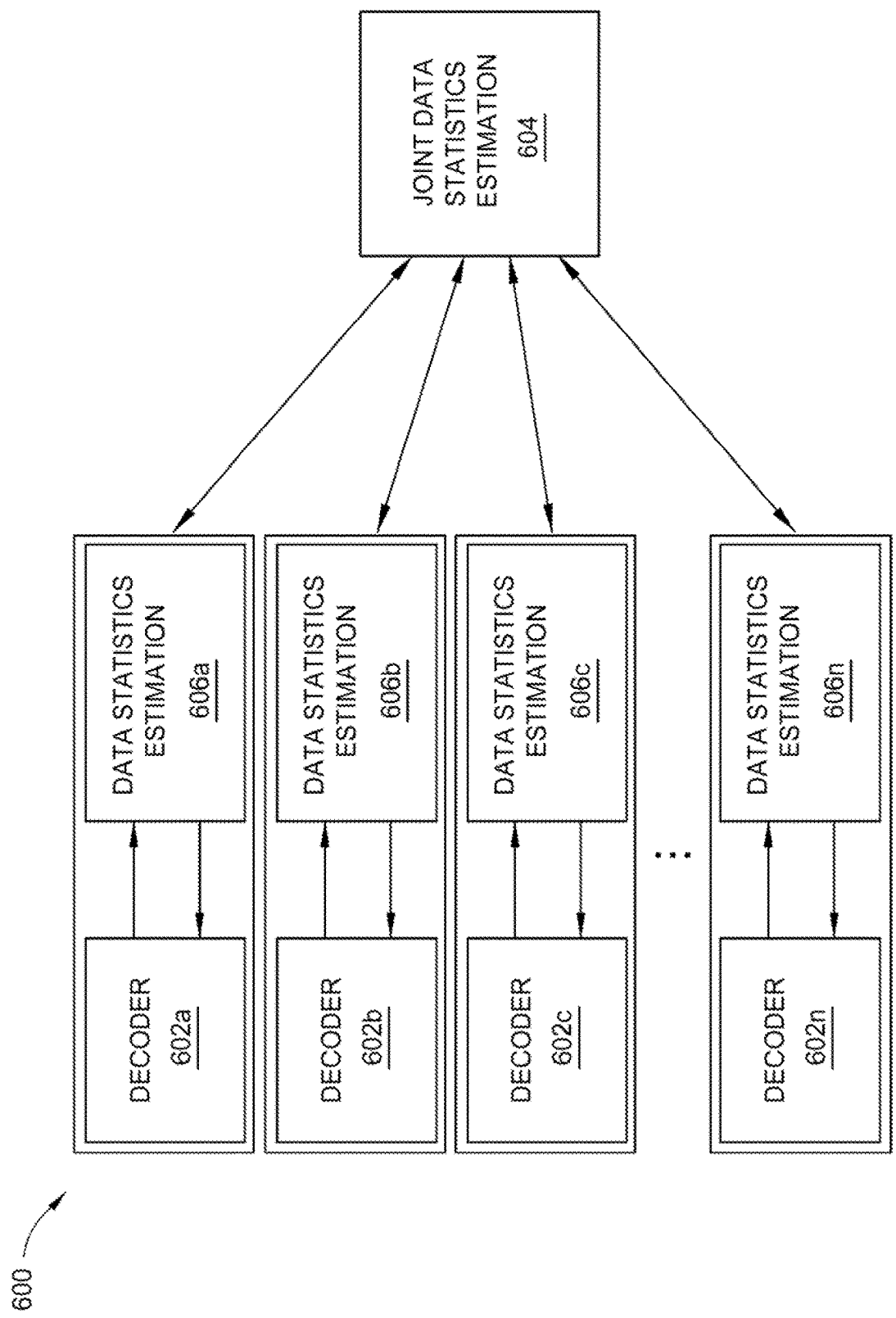
FIG. 6 is a schematic block diagram illustrating an implementation of a selective data sharing ICAD in a decoder pool, according to certain embodiments.

FIG. 6 is a schematic block diagram illustrating an implementation of a selective data sharing ICAD in a decoder pool, according to disclosed embodiments. Aspects of the selective data sharing ICAD in a decoder pool of FIG. 6 may be similar to the aspects of the ICAD in the decoder pool described in FIG. 5. Furthermore, the decoder pool may be the decoder pool 202 of FIG. 2. Rather than coupling each decoder of the plurality of decoders 602a-n to the joint data statistics estimation module 604, such as the embodiment depicted in FIG. 5, each decoder of the plurality of decoders 602a-n are coupled to a respective data statistics estimation module of the plurality of data statistics estimation modules 606a-n. Thus, each decoder—data statistic estimation module pair, such as the first decoder 602a and the first data statistics estimation module 606a is coupled to the joint data statistics estimation module 604.

If there is a mismatch between the data statistics of a decoder, such as the first decoder, and the global statistics of the joint data statics estimation module 604, the decoder may decide to continue using the local data statistics rather than the global statistics. Similarly, the global statistics may not be updated using the local data statistics. The mismatch may be measured by correlation or by some other form of distance, such as a KL or JS divergence, and may hold different thresholds for either side. For example, there may be a case where the global statistics are updated, but not the local data statistics, or vice-versa.

Expanding on the example of FIG. 5, rather than providing the generated first data statistics, the generated second data statistics, and the generated third data statistics directly to the joint data statistics estimation module 604, the generated data statistics may be stored by the relevant data statistics estimation module 606a, 606b. For example, the generated first data statistic and the generated second data statistic are transferred to the joint data statistics estimation module 604 at block 706, where the joint data statistics estimation module 604 generates global statistics and a histogram based on the global statistics at block 710.

However, due to a mismatch of the generated third data statistic and the global statistics provided to the first data statistics estimation module 606a at block 716, the generated third data statistics may be stored locally at block 720. The first data statistics estimation module 606a may then utilize the locally stored aggregated data statistic and the associated histogram rather than the global statistics and the associated histogram at block 720. Each decoder of the plurality of decoders 602a-n may maintain a local data statistic, such that in the case of a mismatch, the more accurate aggregated data statistic and the associated histogram may be utilized.

Furthermore, each of the generated data statistics may be associated with a weight, such that the weight of a newly generated data statistic is weighted as more relevant than an older generated data statistic. The weight may allow for better flexibility and adaptability of the global statistic or the local data statistic to the received codewords, such that the data statistics and the associated histogram places more value on the newly generated codewords. For example, a second generated data statistic may have a greater weight associated with the generated data statistic than that of the first generated data statistic, where the first generated data statistic is generated prior to the second generated data statistic.

Referring to FIG. 5 and FIG. 6, in certain implementations, there may be more than one joint data statistics estimation module, such that a first joint data statistics estimation module is coupled to a second statistics estimation module. Furthermore, it is to be understood that different types of decoders may require different realizations of data statistics. For example, a first decoder, such as a bit flipping decoder, may utilize a "k" bit histogram and a second decoder, such as a message passing decoder, utilizes an "n" bit histogram, where "k" and "n" are the values of the number of bits associated with each histogram. Each group of decoders of the same type (i.e., decoders utilizing "k" bit histograms) will hold a global statistics associated with the same type of data statistic. The joint data statistics estimation module 504, 604 may be configured to store the different types of global statistics individually.

In another example, even though each decoder group mentioned above may be for different books of data statistics (i.e., decoders utilizing "k" bit histograms and decoders utilizing "n" bit histograms), the data from the same distribution may be passed between groups. In order to pass the data between the groups, adjustments may be made to the data. For example, an 8 bit histogram may be transformed to a 4 bit histogram by accumulating over all combinations that share the same 4 MSB without loss of data. In another example, 4 bit histograms may be combined with the results of an 8 bit histogram, where a certain factor is given to each group of 8 bits. In each of the 8 bits, the relevant 4 LSBs or 4 MSB may correspond to a certain value in the 4 bit histogram.

By adapting the architecture of the decoder pool to account for content aware decoding using shared data statistics, the latency of the decoding may decrease, the QoS may be improved, and the correction capability of the decoder may be improved.

In one embodiment, a data storage device is disclosed, that includes an NVM, and a controller coupled to the NVM, that includes a plurality of decoders, that includes a first decoder configured to receive a first codeword, the first decoder configured to generate first data statistics for the first codeword, and a second decoder configured to receive a second codeword, the second decoder configured to generate second data statistics for the second codeword. The data storage device further includes a joint data statistics module configured to receive the first and second data statistics.

The joint data statistics module is further configured to create an data histogram based on the first and second data statistics. The controller is configured to receive a third codeword, the third codeword being assigned to one of the plurality of decoders based on the data histogram. The first codeword and second codeword are substantially similar, and wherein the first data statistics are updated by the second data statistics in the joint data statistics module. The first decoder stores the first data statistics. The controller is configured to receive a third codeword. The first codeword, the second codeword, and the third codeword each assigned to the first decoder based on a syndrome weight or a bit error rate. The first decoder provides the third codeword to one of the plurality of decoders based on the first data statistics. Each decoder of the plurality of decoders includes one of a tier 1 decoder, a tier 2 decoder, and a tier 3 decoder. The controller is configured to receive a third codeword. The third codeword is assigned to one of the tier 1 decoder, the tier 2 decoder, and the tier 3 decoder based on the syndrome weight or the bit error rate.

In another embodiment, a controller for a data storage device is disclosed. The controller includes an I/O to one or more NVMs and a processor configured to perform a method for content aware decoding. The method includes receiving a codeword from the one or more NVMs at a first decoder, generating data statistics for the codeword, and providing the data statistics to a joint statistics module, the joint statistics module coupled to a plurality of decoders that include the first decoder.

Each decoder of the plurality of decoders includes one of a tier 1 decoder, a tier 2 decoder, and a tier 3 decoder. The method further includes receiving a second codeword from one or more of the NVMs and assigning the second codeword to one of the plurality of decoders based on the joint statistics module. Each one of the plurality of decoders locally maintains data statistics and provides data statistics to the joint statistics module. The method further including assigning the second codeword to one of the plurality decoders based on locally maintained data statistics. The method further including where a statistical mismatch is detected between locally maintained data statistics and the joint statistics module. The method further including where one of the joint statistics module and locally maintained data includes a histogram. The method further including where newer ones of the data statistics are weighted as more relevant than older ones of the data statistics.

In another embodiment, a system for storing data is disclosed, including an NVM means, and a controller means for executing a method for content aware decoding. The method includes receiving from the NVM means at a first decoder means of a plurality of decoder means, a first codeword, decoding the first codeword at the first decoder means, and generating a first data statistic based on decoding the first codeword. The method further includes updating a joint data statistics module coupled to each of the plurality of decoder means, with the first data statistic, receiving a second a second codeword from the NVM means, and assigning the second codeword to a second decoder means of the plurality of decoder means, based on a syndrome weight or a bit error rate.

The method further includes generating a second data statistic at the second decoder means and updating the joint data statistics module based on the second data statistics. The second data statistic is weighted as more relevant than the data statistics. Each one of the plurality of decoder means is configured to provide data statistics to the joint data statistics module. The assignment of subsequent codewords from the NVM means to one of the plurality of decoder means is based on the syndrome weight or the bit error rate.

While the foregoing is directed to embodiments of the present disclosure, other and further embodiments of the disclosure may be devised without departing from the basic scope thereof, and the scope thereof is determined by the claims that follow.

What is claimed is:
1. A data storage device, comprising:
a non-volatile memory (NVM); and a controller coupled to the NVM, wherein the controller comprises:
   a plurality of decoders, comprising:
      a first decoder configured to receive a first codeword, the first decoder configured to generate first data statistics for the first codeword; and
      a second decoder configured to receive a second codeword, the second decoder configured to generate second data statistics for the second codeword; and
   a joint data statistics module configured to receive the first and second data statistics, wherein the first and second data statistics join a joint data statistics pool, wherein the joint data statistics module comprises the joint data statistics pool that provides statistics to the plurality of decoders.

2. The data storage device of claim 1, wherein the joint data statistics module is further configured to create an data histogram based on the first and second data statistics.

3. The data storage device of claim 1, wherein the controller is configured to receive a third codeword, the first codeword, the second codeword, and the third codeword each being assigned to one of the plurality of decoders based on a syndrome weight or a bit error rate .

4. The data storage device of claim 1, wherein the first codeword and second codeword are substantially similar, and wherein the first data statistics are updated by the second data statistics in the joint data statistics module.

5. The data storage device of claim 4, wherein the first decoder stores the first data statistics, and wherein the controller is configured to receive a third codeword, the third codeword being assigned to the first decoder based on the joint data statistics, and the first decoder providing the third codeword to one of the plurality of decoders based on the first data statistics.

6. The data storage device of claim 1, wherein each decoder of the plurality of decoders are comprised of one of a tier 1 decoder, a tier 2 decoder, and a tier 3 decoder.

7. The data storage device of claim 6, wherein the controller is configured to receive a third codeword, the third codeword being assigned to one of the tier 1 decoder, the tier 2 decoder, and the tier 3 decoder based on a syndrome weight or a bit error rate.

8. A controller for a data storage device, comprising:
   an I/O to one or more non-volatile memories (NVMs); and
   a processor configured to perform a method for content aware decoding, the method comprising:
      receiving a codeword from the one or more NVMs at a first decoder;
      generating data statistics for the codeword; and
      operating a joint statistics module, the joint statistics module coupled to a plurality of decoders that include the first decoder and providing an output based on shared data statistics from the plurality of decoders.

9. The controller of claim 8, wherein each decoder of the plurality of decoders comprises one of a tier 1 decoder, a tier 2 decoder, and a tier 3 decoder.

10. The controller of claim 9, wherein the method performable by the processor further comprises receiving a second codeword from the one or more NVMs, and assigning the second codeword to one of the plurality of decoders based on a syndrome weight or a bit error rate.

11. The controller of claim 10, wherein the method performable by the processor further comprises wherein each one of the plurality of decoders locally maintains data statistics, and provides data statistics to the joint statistics module.

12. The controller of claim 11, wherein the method performable by the processor further comprises assigning the second codeword to one of the plurality of decoders based on locally maintained data statistics.

13. The controller of claim 12, wherein the method performable by the processor further comprises wherein a statistical mismatch is detected between locally maintained data statistics and the joint statistics module.

14. The controller of claim 13, wherein the method performable by the processor further comprises wherein one of the joint statistics module and locally maintained data statistics each comprise a histogram.

15. The controller of claim 14, wherein the method performable by the processor further comprises wherein newer ones of the data statistics are weighted as more relevant than older ones of the data statistics.

16. A system for storing data, comprising:
   a non-volatile memory (NVM) means; and
   a controller configured to execute a method for content aware decoding, the method comprising:
      receiving from the NVM means at a first decoder of a plurality of decoders, a first codeword;
      decoding the first codeword at the first decoder;
      generating a first data statistic based on decoding the first codeword;
      operating a joint data statistics module coupled to each of the plurality of decoders and configured to generate an output based upon shared data statistics provided by the plurality of decoders, and providing the first data statistic to the joint data statistics module;
      receiving a second codeword from the NVM; and
      assigning the second codeword to a second decoder moans of the plurality of decoders, based on a syndrome weight or a bit error rate.

17. The system of claim 16, wherein the method further comprises generating a second data statistic at the second decoder, and updating the joint data statistics module based on the second data statistics.

18. The system of claim 17, wherein the second data statistic is weighted as more relevant than the shared data statistics.

19. The system of claim 16, wherein each one of the plurality of decoders is configured to providcretain local data statistics.

20. The system of claim 19, wherein assignment of subsequent codewords from the NVM means to one of the plurality of decoders is based on the syndrome weight or the bit error rate.

* * * * *